United States Patent [19]

Akagawa et al.

[11] Patent Number: 5,122,736
[45] Date of Patent: Jun. 16, 1992

[54] APPARATUS FOR AND METHOD OF PRESSING PINS OF AN IC FOR TESTING

[75] Inventors: Minoru Akagawa, Fremont; Heijiro Fukumoto, San Francisco, both of Calif.

[73] Assignee: Intelmatec Corporation, Fremont, Calif.

[21] Appl. No.: 628,702

[22] Filed: Dec. 17, 1990

[51] Int. Cl.5 .................... G01R 31/02; H01R 13/629
[52] U.S. Cl. ........................... 324/158 P; 324/158 F; 439/70; 439/264
[58] Field of Search ............... 324/158 P, 158 F, 72.5, 324/158 R, 731; 439/70, 264, 912, 482; 437/8

[56] References Cited

U.S. PATENT DOCUMENTS

| | | | |
|---|---|---|---|
| 4,839,587 | 6/1989 | Flatley et al. | 324/158 P |
| 4,872,845 | 10/1989 | Korsunsky et al. | 439/70 |
| 4,962,356 | 10/1990 | Eberlein et al. | 324/158 F |
| 4,996,476 | 2/1991 | Balyasny et al. | 324/158 F |

*Primary Examiner*—Vinh Nguyen
*Attorney, Agent, or Firm*—Heller, Ehrman, White, McAuliffe

[57] ABSTRACT

A socket-like structure with contact terminals for testing IC pieces is set at a specified position and a vertically movable block is set above this socket-like structure. A frame surrounding this block is provided with a lock screw by which a pin press can be pressed between the block and the frame either tightly or loosely. The pin press has downwardly protruding edges which are patterned according to the pins of the IC pieces to be tested. The pin press is lowered while it is only loosely pressed between the block and the frame and thereby adjusts its position according to the socket-like structure placed below. The lock screw is tightened thereupon to fasten the pin pressed at this adjusted position. With the pin press thus fastened at the adjusted position, IC pieces to be tested are delivered onto the socket-like structure one at a time and the pin press is lowered to thereby correctly press the pins of the IC piece to be tested against the terminals for the testing device.

12 Claims, 1 Drawing Sheet

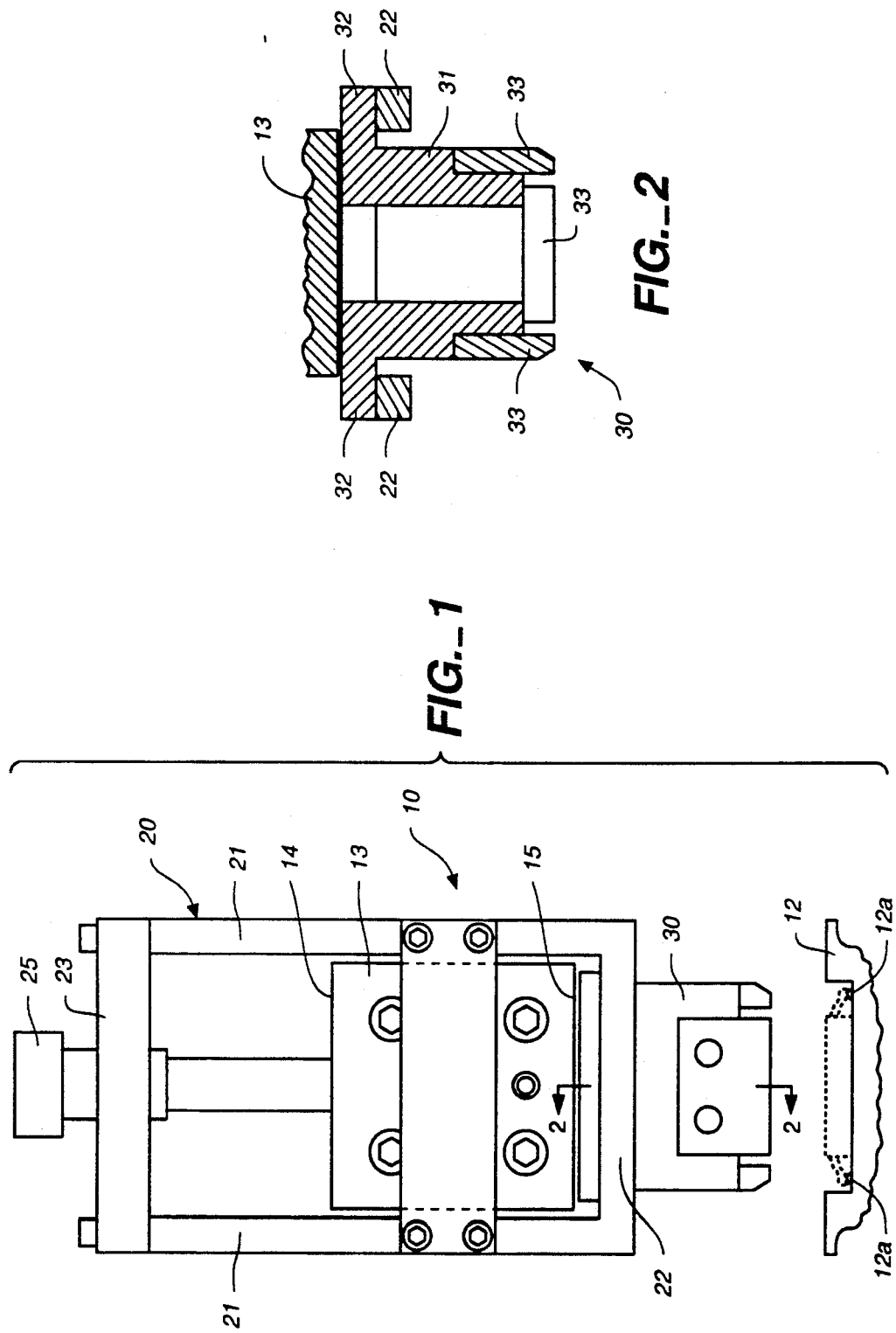

APPARATUS FOR AND METHOD OF PRESSING PINS OF AN IC FOR TESTING

BACKGROUND OF THE INVENTION

This invention relates to an apparatus for and method of pressing pins of an IC against terminal pieces of a testing device so as to make a secure connection between the IC and the testing device through contacts of these pins with the terminal pieces.

IC pieces typically have a large number of leads, or pins, which are thin and easy to break. For testing these IC pieces, use is frequently made of a tester with a socket-like structure having terminal pieces at matching positions and, after the IC piece to be tested is placed on this socket-like structure, it is pressed towards the tester such that the pins of the IC pieces are sure to come into contact with the terminal pieces of the tester to establish correct electrical connection between the IC piece and the tester.

IC pieces are produced generally with high precision and a robot which transports them one by one to the tester is precisely controllable and is capable of placing each IC exactly at an intended position on the tester. The tester, on the contrary, is generally not precisely dimensioned. Errors on the order of about 250 microns are not uncommon. If an IC piece is carelessly pressed against the terminal pieces of a tester which are not precisely dimensioned, those fragile pins may be bent, or otherwise damaged.

SUMMARY OF THE INVENTION

It is therefore an object of the present invention to provide an apparatus for and a method of pressing pins of an IC to be tested against terminal pieces of a testing device without bending or otherwise damaging these pins of the IC although the tester may not be very precisely designed.

It is another object of the invention to provide such an apparatus and method whereby the pins, and not any other parts of the IC piece being tested, are pushed.

Additional objects, advantages and novel features of the invention will be set forth in part in the description which follows, and in part will become apparent to those skilled in the art upon examination of the following or may be learned by practice of the invention. To achieve the foregoing and other objects and in accordance with the purpose of the present invention, a socket-like structure to be used for testing is initially set at a specified position. An apparatus embodying the invention includes a generally cubic block which is movable vertically upward and downward either manually or automatically above the socket-like structure. A frame-like structure surrounds this block and their relative position is adjustable by means of a lock screw. A piece, herein referred to as a pin press because it has downwardly protruding edges for pressing the pins, hangs from this frame-like structure. For adjusting the position of the pin press according to the socket-like structure set below, the pin press is pressed between the frame-like structure and the block but only lightly so as to able to adjust its own position when the apparatus is lowered and the pin press is pressed against the socket-like structure set below. After the position of the pin press is thus adjusted, the lock screw is operated to tightly compress the pin press between the block and the frame-like structure so as to secure its position with respect to the apparatus. After this preparation is done, a robotical system for delivering IC pieces to be tested is operated in coordination with a periodic vertical motion of the pin press to keep depositing IC pieces one at a time on the socket-like structure and the pin press, now correctly positioned with respect to the socket-like structure, is lowered to press their pins correctly against the contact terminals for the testing device.

BRIEF DESCRIPTION OF THE DRAWINGS

The accompanying drawings, which are incorporated in and form a part of the specification, illustrate an embodiment of the present invention and serve to explain the principles of the invention. In the drawings:

FIG. 1 is a front view of an essential portion of an apparatus embodying the present invention, and FIG. 2 is a horizontal sectional view taken along line 2—2 of FIG. 1 of the pin press shown.

DETAILED DESCRIPTION OF THE INVENTION

FIG. 1 is a front view of an essential portion of an apparatus 10 embodying the present invention for pushing pins of an IC piece to be tested. The whole of a device used for the testing itself (such as the production sockets produced and sold by Yamaichi Electronics, Tokyo, Japan) is not shown in FIG. 1 because to such testing devices are well known and are not the subject matter of the present invention. In order to electrically connect the testing device with an IC piece to be tested, use is made of a socket-like structure 12 (serving as a holding means for the IC piece to be tested) with a large number of connector terminals 12a corresponding to the pins of the IC piece. This socket-like structure may be considered a part of the tester and is positioned at a specified position for the testing.

In FIG. 1, numeral 13 indicates a generally cubic block with a flat top surface 14 and a flat bottom surface 15, supported by a mechanism (not shown) so as to be able to move vertically upward and downward selectably either manually or automatically. A driving mechanism for supporting the block 13 and allowing it to move in this manner is well known and hence is neither described herein nor shown in FIG. 1. According to a preferred embodiment of the invention, the block 13 is structured to support a heater which in part protrudes downward from its bottom surface 15 but since this heater has nothing to do with the stated purposes of the invention, the structure of the block 13 is not described herein in any more detail.

With reference still to FIG. 1, numeral 20 indicates a frame-like structure with two vertical side walls 21 which are parallel to each other and connected together at the bottom by two parallel beams 22 (only one of them being visible in FIG. 1) and a top plate 23 at the top. The separation between the two side walls 21 is such that the block 13 is sandwiched therebetween and nearly touches both of them but allows the frame-like structure 20 as a whole to slide upward or downward with respect to the block 13. The top plate 23 is provided with a lock screw 25 which vertically penetrates it. The lower end of the lock screw 25 rests on the flat top surface 14 of the block 13 such that the relative vertical position of the frame-like structure 20 with respect to the block 13 can be controllably varied by rotating this lock screw 25.

The beams 22 connecting the two side walls 21 at the bottom supports a pin press 30 as shown both in FIG. 1 and FIG. 2. The pin press 30 is a unit which is separable from the frame-like structure 20, having a housing 31 with horizontally protruding ledges 32 and downwardly protruding edges 33. The housing 31 and the ledges 32 are so designed that the pin press 30 can not only be supported by the frame-like structure 20 by hanging therefrom with the ledges 32 resting on the horizontal beams 22 but also be moved a little so as to adjust its position and orientation with respect to the beams 22 which support it unless it is being pressed tightly from above by the block 13.

The edges 33 which protrude downward from the housing 31 of the pin press 30 are arranged so as to correspond to the positions of the pins of the IC pieces to be tested. In other words, different pin press units with different edge patterns are to be used for the testing of different kinds of IC pieces. The pin press 30 shown in FIGS. 1 and 2 is designed to be used for IC pieces having a generally square shape with pins protruding from all four sides of the square. Thus, the four edges 33 are shown to form substantially a square-like shape.

To use the apparatus described above, the first step would be to select a pin press with a desired edge pattern, that is, the edge pattern which correctly matches the positions of the pins of the IC pieces to be tested and hence, would be able to press only the pins of such IC pieces, if property positioned. Next, the lock screw 25 is turned and moved upward such that the frame-like structure 20 can be lowered with respect to the block 13. This increases the clearance between the bottom surface 15 of the block 13 and the beams 22 at the lower end of the frame-like structure 20 such that the selected pin press 30 can be passed through this clearance and placed in the position shown in FIG. 1. After the selected pin press 30 thus hangs from the beams 22 by its ledges 32, the lock screw 25 is operated in the reverse direction so as to press down the top surface 14 of the block 13. This effectively raises the frame-like structure 20 with respect to the block 13 and reduces the clearance between the bottom surface 15 of the block 13 and the beams 22. The lock screw 25 is operated until the bottom surface 15 of the block 13 barely comes into contact with the top surface of the housing 31 of the pin press 30. Both the bottom surface 15 of the block 13 and the top surface of the housing 31 of the pin press 30 are flat and smooth, and so are also the top surfaces of the beams 22 and the downwardly facing surfaces of the ledges 32 of the pin press 30 such that the pin press 30 can still be moved within a limited extent with respect to the beams 22.

With the apparatus 10 thus set, a properly selected (regarding the type of IC pieces to be tested) socket-like structure of a testing device is positioned below the apparatus 10 (that is, below the block 13) and maintained at the specified test position by means of the socket-like structure 12. As mentioned above, this socket-like structure 12 is not expected to be precisely dimensioned. To adjust the apparatus 10 to the imperfection peculiar to the given socket-like structure 12, the apparatus 10 is then moved downward by manually lowering the block 13 until the pin press 30 comes into contact with the socket-like structure 12 already set below. Against imperfections on the order of about 250 microns which are common, as explained above, the position of the pin press 30 can be adjusted to the accuracy on the order of 25 microns by this method. After the pin press 30 thus adjusts its position according to the peculiarity of the socket-like structure 12 set below, the lock screw 25 is operated while the apparatus 10, as a whole, is maintained at this lowered position such that the pin press 30 becomes tightly compressed between the bottom surface 15 of the block 13 and the beams 22 and hence that the position of the pin press 30 becomes fixed with respect to the apparatus 10.

The apparatus 10 is now ready for use. The driving mechanism supporting the block 13 is now operated in an automatic driving mode to cause the block 13 to undergo a periodic reciprocating (upward and downward) vertical motion. IC pieces to be tested are usually delivered to the vicinity of the apparatus and a robotically operated system, which is controlled in cooperation with the driving mechanism for the apparatus 10, picks up one IC piece at a time, delivers it to the socket-like structure, and deposits it thereon while the apparatus 10 is at a raised position. Such a robotically operated system is well known and hence is neither explained in detail nor illustrated in FIG. 1. After the robot retracts its arm with which the IC piece to be tested has been deposited on the testing device, the apparatus 10 is lowered and the pin press 30 comes into contact with the deposited IC piece but since the position of the pin press 30 with respect to the apparatus 10 has been adjusted according to the peculiarity of the socket-like structure being used, its edges 33 press the pins of the IC piece correctly against the contact pieces on the socket-like structure. After the pins are thus pressed and the IC piece is tested by the tester of which the socket-like structure 12 may be a part, the apparatus 10 is raised and the robot swings its arm to lift and remove the tested IC piece and deliver another IC piece to be tested next. This cycle of steps is repeated.

The foregoing description of a preferred embodiment of the invention has been presented for purposes of illustration. It is not intended to be exhaustive or to limit the invention to the precise form disclosed, and obviously many modifications and variations are possible in light of the above teaching. Such modifications and variations that may be apparent to persons skilled in the art are intended to be included within the scope of the invention.

What is claimed is:

1. An apparatus for pressing pins of an IC against terminals on a tester for testing said IC, said tester including holding means for holding said IC to be tested, said apparatus comprising
    a vertically movable block, said tester being held securely at a specified test position below said vertically movable block,
    pressing means for pressing pins of said IC which is placed on said tester at said test position, said pressing means having downwardly protruding edges which are arranged according to the positions of said pins of said IC,
    supporting means for supporting said pressing means thereon above said test position, and
    fastening means for selectably pressing said pressing means between said holding means and said vertically movable block either securely so as to disallow or loosely so as to allow said pressing means to adjust its position between said holding means and said vertically movable block.

2. The apparatus of claim 1 wherein said vertically movable block has a flat, smooth bottom surface.

3. The apparatus of claim 2 wherein said pressing means has a smooth top surface which is parallel to and opposite to said bottom surface of said block.

4. The apparatus of claim 1 wherein said supporting means a frame, having a top plate and horizontal beams and enclosing said block therein.

5. The apparatus of claim 4 wherein said pressing means has horizontally protruding ledges such that said pressing means can hang from said horizontal beams by said ledges.

6. The apparatus of claim 3 wherein said fastening means comprises a lock screw passing through said top plate of said supporting means and reaching said block to thereby support said supporting means on said block.

7. A method of pressing pins of an IC against terminals on a tester for testing said IC, said method comprising the steps of placing said tester with said terminals at a specified test position, lowering a pin press into said tester from above, said pin press having downwardly protruding edges which are arranged according to the positions of said pins of said IC, said pin press being supported by a supporting member so as to be able to move with respect to said supporting member, to thereby cause said pin press to move with respect to said supporting member to assume an adjusted position with respect to said supporting member according to the positions of said terminals on said tester, fastening said pin press to said supporting member while said pin press is at said adjusted position, lifting said pin press and thereafter placing an IC piece to be tested on said tester at said specified test position, and lowering said pin press onto said IC piece placed on said tester, said pin press being then fastened to said supporting member at said adjusted position.

8. The method of claim 7 wherein said pin press is lifted and lowered by providing a vertically movable block which supports said supporting member, causing at least a part of said pin press to be sandwiched between said block and said supporting member, and causing said movable block to move upward and downward.

9. The method of claim 8 wherein said vertically movable block has a flat, smooth bottom surface and said pin press has a smooth top surface which is parallel to and opposite to said bottom surface of said block.

10. The method of claim 8 wherein said supporting member a frame, having a top plate and horizontal beams and enclosing said block therein.

11. The method of claim 10 wherein said pin press has horizontally protruding ledges such that said pin press can hang from said horizontal beams by said ledges.

12. The method of claim 10 wherein said pin press is fastened to said supporting member by means of a lock screw which penetrates said top plate.

* * * * *